United States Patent
Yamakawa

[11] Patent Number: 5,161,305
[45] Date of Patent: Nov. 10, 1992

[54] METHOD OF PROCESSING A CIRCUIT BOARD

[75] Inventor: Akira Yamakawa, Osaka, Japan

[73] Assignee: Sumitomo Electric Industries, Ltd., Osaka, Japan

[21] Appl. No.: 783,637

[22] Filed: Oct. 24, 1991

[30] Foreign Application Priority Data

Nov. 5, 1990 [JP] Japan ................... 2-300348

[51] Int. Cl.$^5$ .............................. H05K 3/02
[52] U.S. Cl. ........................ 29/846; 65/61; 83/53; 83/177; 156/667; 264/61; 428/698; 501/96
[58] Field of Search ............. 29/846; 156/667; 65/61; 83/177, 53; 264/61; 428/698; 501/96

[56] References Cited

U.S. PATENT DOCUMENTS

| | | | |
|---|---|---|---|
| 3,284,878 | 11/1966 | Best | 83/177 X |
| 4,578,232 | 3/1986 | Huseby et al. | 264/61 X |
| 4,591,537 | 5/1986 | Aldinger et al. | 428/698 |
| 4,728,379 | 3/1988 | Audi et al. | 83/53 X |
| 4,906,511 | 3/1990 | Sato et al. | 428/698 X |
| 4,961,987 | 10/1990 | Okuno et al. | 428/698 X |
| 5,063,121 | 11/1991 | Sato et al. | 501/96 X |

FOREIGN PATENT DOCUMENTS 63-131501 6/1988 Japan.

OTHER PUBLICATIONS

Kino Zairyo, p. 60, Oct. 1987 by N. Iwase enclosed are pp. 57-66.

*Primary Examiner*—Carl J. Arbes
*Attorney, Agent, or Firm*—W. G. Fasse

[57] ABSTRACT

In a method of processing a circuit board formed of an aluminum nitride sintered body, a substrate (100) formed of an aluminum nitride sintered body is prepared. A groove (101) and a hole (102) are formed in the substrate (100) formed of the aluminum nitride sintered body by directing a water jet to a surface of the substrate (100). Alternatively, interconnection layers (104) and an electric resistant body (103) connecting the interconnection layers (104) are formed on the surface of the substrate (100), and a notch portion (105) is formed in the electric resistant body (103) by directing the water jet to the surface of the electric resistant body (103). In this manner, processing of the substrate (100) and adjustment of an electrical resistance value of the electric resistant body (103) can be carried out precisely.

9 Claims, 1 Drawing Sheet

METHOD OF PROCESSING A CIRCUIT BOARD

FIELD OF THE INVENTION

The present invention relates to a method of processing a circuit board and, more specifically, to a method of processing a circuit board formed of an aluminum nitride sintered body.

BACKGROUND INFORMATION

Recently, semiconductor devices having higher speed of operation and a higher degree of integration have been developed, and the degree of integration in LSIs has been significantly improved. Consequently, heat radiation of the substrate material on which semiconductor elements are mounted has come to be of greater importance.

Alumina ($Al_2O_3$) has been used as a ceramics for IC boards. However, since the conventional alumina sintered body has a low thermal conductivity, the heat radiation is not sufficient. Therefore, it has become more difficult to use alumina sintered bodies as ceramics for substrates which can sufficiently cope with the increase of heat emitted from IC chips.

In view of the foregoing, substrates, heat sinks and packages using aluminum nitride having high a thermal conductivity have come to attract attention as a good substitute for alumina substrates. Research has been made for practical applications of aluminum nitride.

Aluminum nitride is a material which inherently has a high thermal conductivity and a high electrical insulation but unlike beryllia porcelain which also has a high thermal conductivity, aluminum nitride has no toxicity. Therefore, it is considered as a promising insulating material or packaging material for semiconductor devices.

In a conventional method of processing circuit boards formed of alumina, a large thin plate is formed by a sheet forming method, the sheet is provided with grooves forming rated break lines by laser processing, and the thin plate is divided into pieces by fracturing along said rated break lines. Substrates formed of alumina have been processed variously by using laser, and the substrates have been widely used as insulating substrates for ICs.

Similar laser processing has been proposed for processing substrates formed of aluminum nitride. However, aluminum nitride is decomposed into Al and $N_2$ gas by laser irradiation. Consequently, Al is deposited at portions processed by the laser, degrading the insulation of the aluminum nitride substrate. A conductive layer as an electric resistant body is formed on a circuit board formed of aluminum nitride. In order to adjust the electric resistance value of the electric resistant body, the conductive layer is selectively removed by laser irradiation. In this case also, Al is deposited at portions processed by the laser, causing fluctuation of the electrical resistantce value of the electric resistant body. Therefore it becomes difficult to adjust the electric resistance value of the electric resistant body to a desired value.

In order to solve such problems, a method is disclosed in Japanese Patent Laying-Open No. 63-131501 in which oxygen is supplied to portions processed by a laser during laser processing or after laser processing, so as to oxidize any deposited Al and to form alumina. This method is said to enable the adjustment of the resistance value of the electric resistant body selectively removed by laser irradiation to a prescribed value.

As disclosed in Kino Zairvo (functional material) October, 1987, p. 60, laser processing and the selection of laser conditions in water have been proposed to prevent a decrease of the insulation resistance at portions irradiated by a laser and resulting from a decomposition of aluminum nitride by laser energy.

However, so long as the aluminum sintered body is processed by laser irradiation, deposition of Al at portions irradiated by the laser cannot be perfectly avoided even if the best processing conditions are selected. Consequently, it is often necessary to remove the deposited Al after processing by using an acid or an alkali solution.

Especially, irradiation by a laser of an aluminum nitride sintered body itself causes corrosion of the aluminum nitride sintered body, and circuit portions formed on the surface of the aluminum nitride sintered body are affected. Laser processing of circuit boards formed of aluminum nitride sintered body has various difficulties. The scribing of, trimming of, or forming holes in aluminum nitride substrates are difficult in practice so long as laser irradiation is employed.

SUMMARY OF THE INVENTION

It is an object of the present invention to eliminate the above described problems of laser processing and to provide a method of processing circuit boards formed of aluminum nitride sintered body which can be easily brought into practice.

The method of processing circuit boards formed of aluminum nitride sintered body in accordance with the present invention includes a method of removing a portion of the aluminum nitride sintered body by using a water jet technique. Preferably, the step of removing a portion of the aluminum nitride sintered body includes formation of a groove on the surface of the aluminum nitride sintered body or formation of a through hole in the aluminum nitride sintered body.

The method of processing circuit boards formed of aluminum nitride sintered body in accordance with another aspect of the present invention includes a method of removing a portion of a conductive layer formed on the surface of the aluminum nitride sintered body by using a water jet technique. Preferably, the step of removing a portion of the conductive layer includes a step of selectively removing a conductive layer including an electrical resistant body.

In the water jet technique employed in the present invention, water is spouted out from a nozzle at high speed under high pressure, the jet of the water being directed to the object to be processed, so that desired processing is done. A known water jet technique is employed for removing the aluminum nitride sintered body in the present invention. Pure water, water containing polymers as an additive, or water containing abrasive powder as an additive is used as the jet. The additives of the jet may be selected in consideration of the efficiency of processing and the objects of processing. In the processing method of the circuit boards of the present invention, the nozzle diameter of the water jet should be as small as possible in view of process precision. Preferably, a nozzle having a diameter of about 0.1 mm is used. The pressure of the water jet should be selected in accordance with the object of processing. Especially when the conductive layer is to be selectively removed for adjusting the electric resistance value of the electric resistant body formed on the aluminum nitride sintered body, the pressure of water jet should be selected from a wide range.

The distance between the spray nozzle and the object to be processed, and the speed of feeding the nozzle are set appropriately in accordance with the object of processing. However, if the distance between the nozzle and the object to be processed is too large, the jet of water from the nozzle is diffused in the radial direction, preventing highly precise processing. Therefore, in order to process circuit boards with a high precision, the distance between the nozzle and the object should be about 30 times of the nozzle diameter at the most.

Removal of portions of aluminum nitride substrates, formation of through holes and recessed portions are possible by the water jet technique. In addition, the water jet technique enables a continuous formation of through holes and recessed portions, and therefore the formation of rated break lines is facilitated for a following fracturing and dividing the circuit substrates along the break lines. The processing of the rated break line may be effected before or after formation of a metallized layer on the substrate of the aluminum nitride sintered body.

After a circuit pattern including a thick or thin film electric resistant body is formed on a substrate of aluminum nitride, trimming of the conductive layer by using a water jet technique can be done for adjusting the electrical resistance value of the electric resistant body. In that case, Al is not deposited at the processed portion when a water jet technique is used. Therefore, the electrical resistance value of the electric resistant body formed on the circuit board made of an aluminum nitride sintered body can be precisely adjusted. Compared to processing by laser irradiation, corrosion of the aluminum nitride sintered body can be prevented and circuit portions formed on the substrate of the aluminum nitride sintered body are not affected when a water jet technique is used. Therefore, when a water jet technique is employed, a method of processing circuit boards formed of an aluminum nitride sintered body suitable for practical use in which Al is not deposited can be provided.

The aluminum nitride sintered body employed in the present invention is highly pure and of high density, and hence it has a high thermal conductivity. Therefore, it can be used as a material for a heat sink or the like in applications requiring heat radiation. The aluminum nitride sintered body has a thermal expansion coefficient of about $4.5 \times 10^{-6}$ [11%] and a permittivity or relative dielectric constant of about 8.5, when a high frequency of 10 MHz is applied. These characteristics make aluminum nitride suitable for use as circuit boards and in electronic tubes. Highly pure aluminum nitride powder mixed with $Y_2O_3$ powder as sintering assistant and with a transition metal for intercepting light is used as the raw material of the aluminum nitride sintered body.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Example 1

Figure 1:
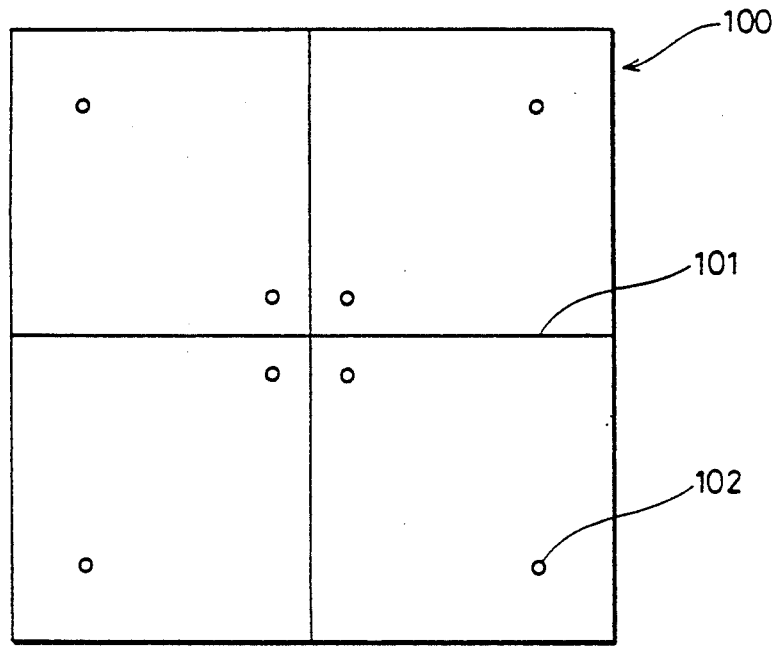
FIG. 1 is a plan view of the aluminum nitride substrate obtained in example 1.

A sheet was formed of a slurry of aluminum nitride powder including $Y_2O_3$ powder by 3.0% of weight, and the sheet was sintered to provide a substrate (50.8 mm $\times$ 50.8 mm) formed as an aluminum nitride sintered body having a thickness of 0.635 mm. FIG. 1 is a plan view of the substrate formed of the aluminum nitride sintered body provided in this manner. Referring to FIG. 1, an abrasive jet including SiC grains was spouted out onto the aluminum nitride substrate 100 with the pressure of 100 MPa, whereby through holes were formed in the aluminum nitride substrate 100. The diameter of the cemented carbide nozzle of the water jet was 0.1 mm. In this manner, eight through holes 102 having a diameter of 1.0 mm were formed in the aluminum nitride substrate 100. Under the same condition of the water jet, the nozzle was moved at a prescribed feeding speed while spouting the abrasive jet onto the aluminum nitride substrate 100, two rated break lines 101 having a width of 0.2 mm and a depth of 0.2 mm were formed so as to cross each other. The aluminum nitride substrate 100 was divided into four sections along the break lines 101.

The so prepared aluminum nitride substrate did not include any damaging depositions, and the insulation at processed portions of the rated break lines was not degraded.

Example 2

Figure 2:
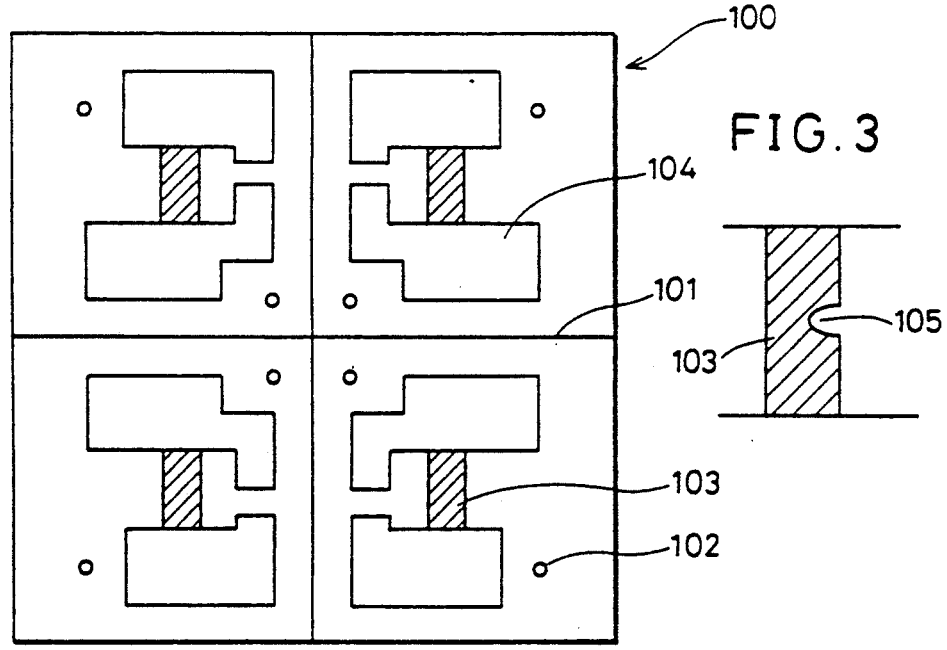
FIG. 2 is a plan view showing a circuit board formed of the aluminum nitride sintered body obtained in example 2.

A two-layered thin film wiring pattern including an NiCr layer and an Au layer, and a single conductive layer serving as an electric resistant body formed of NiCr, was formed by using a sputtering device on the aluminum nitride substrate 100 provided by example 1. FIG. 2 is a plan view showing the aluminum nitride substrate provided in this manner. Referring to FIG. 2, two-layered interconnection layers 104 including an NiCr layer and an Au metallized layer formed thereon in accordance with a prescribed pattern was formed on the aluminum nitride substrate 100. An electric resistant body 103 for interconnecting the layers 104 was formed by an NiCr layer.

Figure 3:
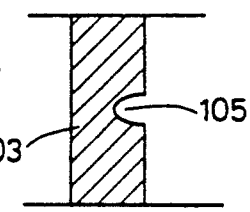
FIG. 3 is an enlarged plan view showing a trimmed electric resistant body in example 2.

In order to adjust the electrical resistance value of the electric resistant body 103 to a desired value, for example 50Ω, the electric resistant body 103 was trimmed by using the water jet apparatus of example 1. The conditions of the water jet were: a jet of water only was used, the pressure was 200 MPa, and the jet was directed onto the surface of the electric resistant body 103. FIG. 3 is an enlarged plan view showing the state of the trimming of the electric resistant body. Referring to FIG. 3, the electric resistant body 103 had a notched portion 105 which was selectively removed by the water jet. The electrical resistance value of the electric resistant body 103 could be adjusted in the range of 50±0.5Ω. Thereafter, the substrate 100 was fractured into four sections along the break line 101. No defect was found on the aluminum nitride substrate 100 on which the interconnection layers 104 and the electric resistant body 103 were formed.

Example for comparison

The process for forming holes, the break line processing and the trimming carried out in examples 1 and 2 were effected by using a laser. Al was deposited at portions irradiated by the laser, the insulation at scribed surfaces was not good, and the electrical resistance value was decreased abruptly at the electric resistance portion which was trimmed. It was determined that the aluminum nitride substrate provided in this manner could not be used as a circuit board.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of processing a circuit board formed of an aluminum nitride sintered body, comprising the steps of:
    preparing a substrate (100) formed of the aluminum nitride sintered body; and
    removing a portion (101; 102) of the aluminum nitride sintered body forming said substrate, by directing a water jet to a surface of said substrate.

2. The method of processing a circuit board according to claim 1, wherein
    said step of removing a portion of said aluminum nitride sintered body includes the step of forming a groove (101) on a surface of said aluminum nitride sintered body.

3. The method of processing a circuit board according to claim 1, wherein
    said step of removing a portion of said aluminum nitride sintered body includes the step of forming a through hole (102) in said aluminum nitride sintered body.

4. The method of processing a circuit board according to claim 1, wherein
    said step of removing a portion of said aluminum nitride sintered body includes the step of directing a water jet sprayed out from a nozzle having a diameter of 0.1 mm to a surface of said substrate.

5. The method of processing a circuit board according to claim 1, wherein
    said step of removing a portion of said aluminum nitride sintered body is carried out under a condition that a distance between said nozzle from which said water jet is spouted out and the surface of said substrate is 30 times the diameter of said nozzle at the most.

6. The method of processing a circuit board according to claim 1, wherein
    said step of removing a portion of said aluminum nitride sintered body includes the step of directing a water jet containing abrasive powder to the surface of said substrate.

7. A method of processing a circuit board formed of an aluminum nitride sintered body, comprising the steps of:
    preparing a substrate (100) formed of the aluminum nitride sintered body,
    forming a conductive layer (103; 104) on a surface of said substrate, and
    removing a portion (105) of said conductive layer (103) by directing a water jet to the surface of said conductive layer.

8. The method of processing a circuit board according to claim 7, wherein
    said step of removing a portion of the conductive layer includes the step of selectively removing said conductive layer (103) for forming an electric resistant body.

9. The method of processing a circuit board according to claim 8, wherein
    said step of removing a portion of said conductive layer includes the step of forming a notched portion (105) in said conductive layer (103).

* * * * *